United States Patent
Han et al.

(10) Patent No.: US 12,127,451 B2
(45) Date of Patent: Oct. 22, 2024

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Shikai Qin, Beijing (CN); Tingliang Liu, Beijing (CN); Yi Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 414 days.

(21) Appl. No.: 17/426,111

(22) PCT Filed: Jan. 22, 2021

(86) PCT No.: PCT/CN2021/073337
§ 371 (c)(1),
(2) Date: Jul. 28, 2021

(87) PCT Pub. No.: WO2021/148005
PCT Pub. Date: Jul. 29, 2021

(65) Prior Publication Data
US 2022/0320242 A1    Oct. 6, 2022

(30) Foreign Application Priority Data
Jan. 23, 2020 (CN) .......................... 202010076396.3

(51) Int. Cl.
*H10K 59/131* (2023.01)
*G06F 1/16* (2006.01)

(52) U.S. Cl.
CPC ......... *H10K 59/131* (2023.02); *G06F 1/1652* (2013.01)

(58) Field of Classification Search
CPC .... H10K 59/12; H10K 59/131; H10K 50/865; H10K 59/8792; H10K 50/86; G06F 1/1652; G09F 9/301
See application file for complete search history.

(56) References Cited

U.S. PATENT DOCUMENTS 8,233,114 B2 *  7/2012  Mimura ................ G03F 7/0007
                                                            359/613
9,972,809 B2 *  5/2018  Chu .................... H10K 59/1213
(Continued)

FOREIGN PATENT DOCUMENTS

CN    107154416 A    9/2017
CN    107393931 A    11/2017
(Continued)

OTHER PUBLICATIONS

International Search Report for PCT/CN2021/073337 Mailed Apr. 8, 2021.

*Primary Examiner* — Rockshana D Chowdhury
*Assistant Examiner* — Martin Antonio Asmat Uceda
(74) *Attorney, Agent, or Firm* — Ling Wu; Stephen Yang; Ling and Yang Intellectual Property

(57) ABSTRACT

Disclosed are a display panel and a display apparatus. The display panel is divided into a display area and a non-display area surrounding the display area. The non-display area is provided with a fan-out area. The display panel includes: a substrate and a first power wire arranged on the substrate. The first power wire is located in the non-display area. At least part of an orthographic projection of the first power wire on the substrate is located in the fan-out area. The first power wire is provided with a plurality of first hollow parts in a direction perpendicular to the substrate.

12 Claims, 10 Drawing Sheets

(56) References Cited

U.S. PATENT DOCUMENTS

| | | | |
|---|---|---|---|
| 11,126,291 B2* | 9/2021 | Wang | G06F 3/04164 |
| 11,605,693 B2* | 3/2023 | Ahn | H05K 1/028 |
| 2015/0279271 A1* | 10/2015 | Xi | H10K 59/131 |
| | | | 345/76 |
| 2017/0062772 A1* | 3/2017 | Chu | H10K 59/131 |
| 2017/0256599 A1 | 9/2017 | Kim et al. | |
| 2017/0288009 A1 | 10/2017 | Kim et al. | |
| 2017/0345877 A1* | 11/2017 | Hwang | H10K 59/131 |
| 2020/0119124 A1* | 4/2020 | Ahn | H10K 77/111 |
| 2021/0191550 A1* | 6/2021 | Wang | G06F 3/0446 |

FOREIGN PATENT DOCUMENTS

| | | |
|---|---|---|
| CN | 109671868 A | 4/2019 |
| CN | 111261686 A | 6/2020 |
| JP | 2009-10258 A | 1/2009 |
| TW | 201944139 A * | 11/2019 |

* cited by examiner

DISPLAY PANEL AND DISPLAY APPARATUS

CROSS-REFERENCE TO RELATED APPLICATIONS

The present disclosure is a U.S. National Phase Entry of International Application No. PCT/CN2021/073337 having an international filing date of Jan. 22, 2021, which claims priority to Chinese Patent Application No. 202010076396.3, filed to the CNIPA on Jan. 23, 2020 and entitled "Display Panel and Display Apparatus". The above-identified applications are hereby incorporated into this application by reference in their entirety.

TECHNICAL FIELD

Embodiments of the present disclosure relate, but are not limited to, the technical field of display, and particularly to a display panel and a display apparatus.

BACKGROUND

Flexible displays have many advantages of impact resistance, strong shock resistance, light weight, small volume, more convenience in carrying, and the like, which is the main trend of future development. A flexible display includes: a display panel and a cover plate. A non-display area of the display panel is provided with a power wire, which is arranged to provide a power signal for a display area, so as to realize displaying. The cover plate fits the display panel, and the edge of the cover plate is provided with printing ink to cover the non-display area. In order to prevent the printing ink from entering the display area, the fit tolerance will be considered when the cover plate fits the display panel. In this way, the power wire located in the non-display area is not completely covered by the printing ink on the cover plate.

SUMMARY

The following is a brief introduction for the subject matter described in the present disclosure in detail. The brief introduction is not intended to limit the scope of protection of claims.

The present disclosure provides a display panel. The display panel includes a display area and a non-display area surrounding the display area. The non-display area is provided with a fan-out area. The display panel includes: a substrate and a first power wire arranged on the substrate.

The first power wire is located in the non-display area. At least part of the orthographic projection of the first power wire on the substrate is located in the fan-out area. The first power wire is provided with a plurality of first hollow parts in the direction perpendicular to the substrate.

In an exemplary implementation manner, the first power wire further includes a plurality of second power wires extending out from the first power wire. At least one of the first hollow parts is located between at least two of the plurality of second power wires. Both ends of each of the plurality of second power wires are connected to the first power wire.

In an exemplary implementation manner, the plurality of second power wires are arranged in the direction parallel to the extending direction of the first power wire, and the plurality of second power wires and the plurality of first hollow parts are arranged alternately one by one.

In an exemplary implementation manner, a shape of a cross section, perpendicular to the substrate, of one or more of the plurality of first hollow parts includes: a rectangle.

In an exemplary implementation manner, when there are a plurality of the first hollow parts, the plurality of first hollow parts are arranged in rows and columns.

First hollow parts located in a same row are arranged in parallel. An included angle between long edges of two adjacent rows of the first hollow parts is greater than 0° and less than or equal to 180°.

In an exemplary implementation manner, the display panel further includes: a plurality of pixels arranged on the substrate. The plurality of pixels are located in the display area.

For the first hollow parts located in the same row, a sum of a width of each first hollow part and a distance between two adjacent first hollow parts is equal to an integral multiple of a dimension of a corresponding pixel.

In an exemplary implementation manner, the display panel further includes: an insulating layer, a light-absorbing layer located in the non-display area, and a thin film transistor and a pixel defining layer, wherein the thin film transistor and a pixel defining layer are located in the display area.

The insulating layer is located between the light-absorbing layer and the first power wire. The first power wire is arranged on the same layer as a source-drain electrode of the thin film transistor.

The light-absorbing layer is arranged on the same layer as the pixel defining layer, and is configured to absorb the light reflected by the first power wire.

In an exemplary implementation manner, the light-absorbing layer includes: a plurality of light-absorbing structures.

The plurality of light-absorbing structures are in one-to-one correspondence with the plurality of first hollow parts.

In an exemplary implementation manner, orthographic projections of the plurality of light-absorbing structures on the substrate coincide with orthographic projections of the corresponding first hollow parts on the substrate.

Or, there is an overlapped area between orthographic projections of the plurality of light-absorbing structures on the substrate and orthographic projections of the corresponding first hollow parts on the substrate.

In an exemplary implementation manner, orthographic projections of the plurality of light-absorbing structures on the substrate covers orthographic projections of the corresponding first hollow parts on the substrate.

One or more of the plurality of light-absorbing structures include: a first light-absorbing part and a second light-absorbing part formed integrally. The first light-absorbing part is located on one side, close to the first power wire, of the second light-absorbing part.

The orthographic projection of the first light-absorbing part on the substrate coincides with the orthographic projection of the corresponding first hollow part on the substrate. There is an overlapped area between orthographic projections of the second light-absorbing part on the substrate and orthographic projections of the corresponding first hollow part on the substrate.

In an exemplary implementation manner, the light-absorbing layer includes: a plurality of second hollow parts.

The plurality of second hollow parts are in one-to-one correspondence with the plurality of first hollow parts.

In an exemplary implementation manner, orthographic projections of the plurality of second hollow parts coincide with the orthographic projections of the corresponding first hollow parts on the substrate.

Or, there is an overlapped area between orthographic projections of the plurality of second hollow parts on the substrate and orthographic projections of the corresponding first hollow parts on the substrate.

In an exemplary implementation manner, one or more of the plurality of second power wires include: a plurality of wires. The plurality of wires are arranged in the extending direction of the second power wires. A first end of the ith wire is connected to a second end of the (i−1)th wire. A second end of the ith wire is connected to a first end of the (i+1)th wire.

The extending directions of odd wires are the same, and the extending directions of even wires are the same. An included angle between two adjacent wires is greater than 0° and less than or equal to 180°.

A sum of the width of each second power wire and the distance between two adjacent second power wires is equal to an integral multiple of the dimension of the corresponding pixel located in the display area.

The present disclosure further provides a display apparatus, including any of the above-mentioned display panels.

After the accompanying drawings and detailed descriptions are read and understood, other aspects may be understood.

Other features and advantages of the present disclosure will be illustrated in subsequent specification, and in addition, partially become apparent from the specification, or be understood by implementing the present disclosure. Other advantages of the present disclosure can be implemented and achieved by the solutions described in the specification and accompanying drawings.

BRIEF DESCRIPTION OF DRAWINGS

The accompanying drawings are used for providing understanding of technical solutions of the present disclosure, constitute a part of the specification, and are used for explaining the technical solutions of the present disclosure together with embodiments of the present disclosure, but do not constitute a limitation to the technical solutions of the present disclosure.

DETAILED DESCRIPTION

Figure 1:
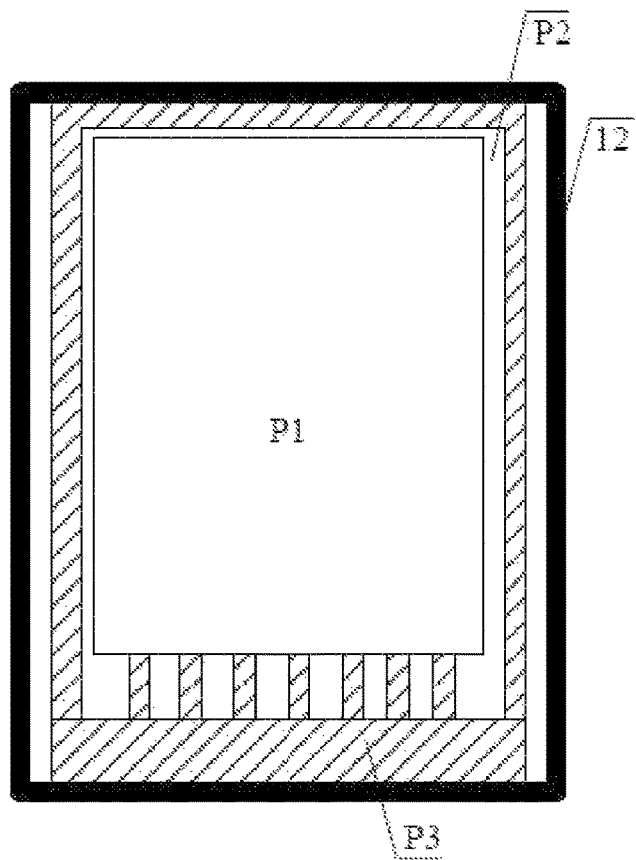
FIG. 1 is a vertical view of a display panel provided by an embodiment of the present disclosure.

The present disclosure describes a plurality of embodiments. However, these embodiments are all exemplary, but not restrictive. In addition, for those of ordinary skill in the art, there may be more embodiments and implementation solutions within the scope included in the embodiments described in the present disclosure. Although many possible feature combinations are shown in the accompanying drawings and are discussed in specific implementation manners, many other combinations of the disclosed features are also possible. Unless specifically restricted, any feature or element of any embodiment may be combined for use with any other feature or element in any other embodiments, or may replace any other feature or element in any other embodiment.

The present disclosure includes and envisages combinations with the features and the elements known to those of ordinary skill in the art. The embodiments, features, and elements that have been disclosed by the present disclosure may also be combined with any conventional features or elements, so as to form a unique disclosure solution defined by claims. Any feature or element of any embodiment may also be combined with the features or elements from other disclosure solutions, so as to form another unique disclosure solution defined by claims. Therefore, it should be understood that any feature shown and/or discussed in the present disclosure may be implemented independently or in any appropriate combination. Therefore, the embodiments are not subject to other restrictions except those made in accordance with the appended claims and their equivalent substitutions. In addition, various modifications and changes may be made within the scope of protection of the appended claims.

In addition, the specification may have presented a method and/or a process in a specific step sequence when representative embodiments are described. However, the method or process should not be limited to the steps in specific sequence insofar as that the method or process does not depend on the specific sequence of the steps described herein. Those of ordinary in the art will understand that other step sequence may also be possible. Therefore, specific sequence of the steps illustrated in the specification should not be interpreted as a limitation of claims. In addition, the claims with respect to the method and/or process should not be limited to execute their steps according to the written sequence. A person skilled in the art may easily understand that these sequences may change, and are still maintained in the spirit and scope of the embodiments of the present disclosure.

Unless otherwise defined, the technical terms or scientific terms publicly used in the embodiments of the present disclosure shall have common meanings understood by those of ordinary in the art of the present disclosure. "First", "second", and similar terms used in the embodiments of the present disclosure are only used to distinguish different components without indicating any sequence, quantity, or importance. "Include", "comprise", or similar words are intended to indicate that the elements or objects preceding the words cover the elements or objects and their equivalents listed after the words, without excluding other elements or objects. "Connect", "interconnect", or similar words are not limited to physical or mechanical connection but may include electrical connection, either direct or indirect. "Above", "below", "left", "right", and the like are only used to indicate relative position relationships. When the absolute position of the described object changes, the relative position relationship may also change accordingly.

In order to improve the display performance, the power wire is usually made of a metal. However, the metal reflects light easily, and the light reflected by the power wire that is not covered by the printing ink is visible to naked eyes, which affects the display effect.

The embodiments of the present disclosure provide a display panel and a manufacturing method thereof, and a display apparatus.

Figure 2:
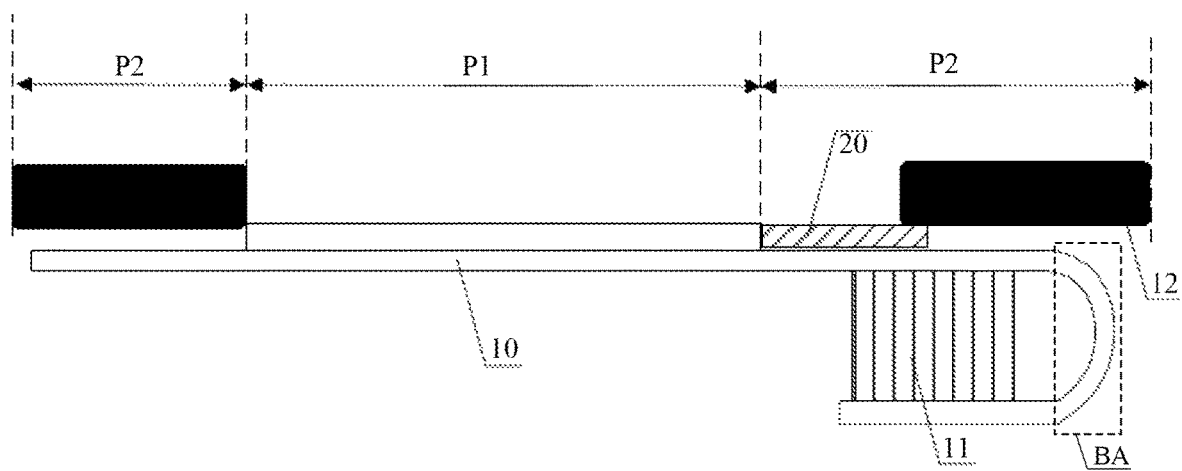
FIG. 2 is a side view of a display panel provided by an embodiment of the present disclosure.
Figure 3:
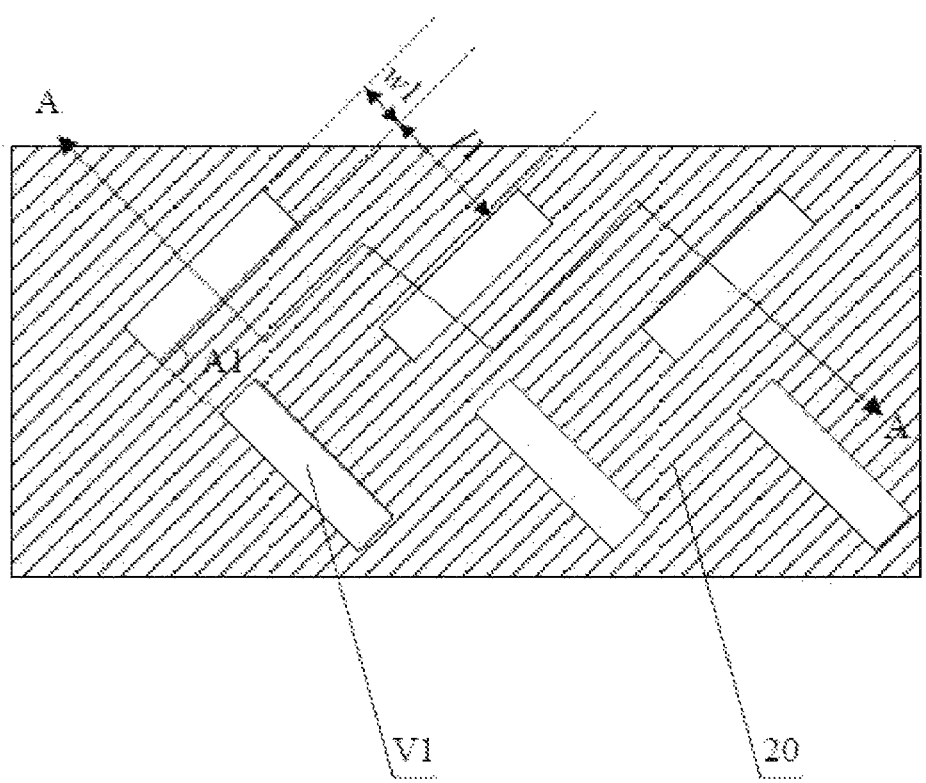
FIG. 3 is a vertical view of a first power wire provided by an embodiment of the present disclosure.
Figure 4:
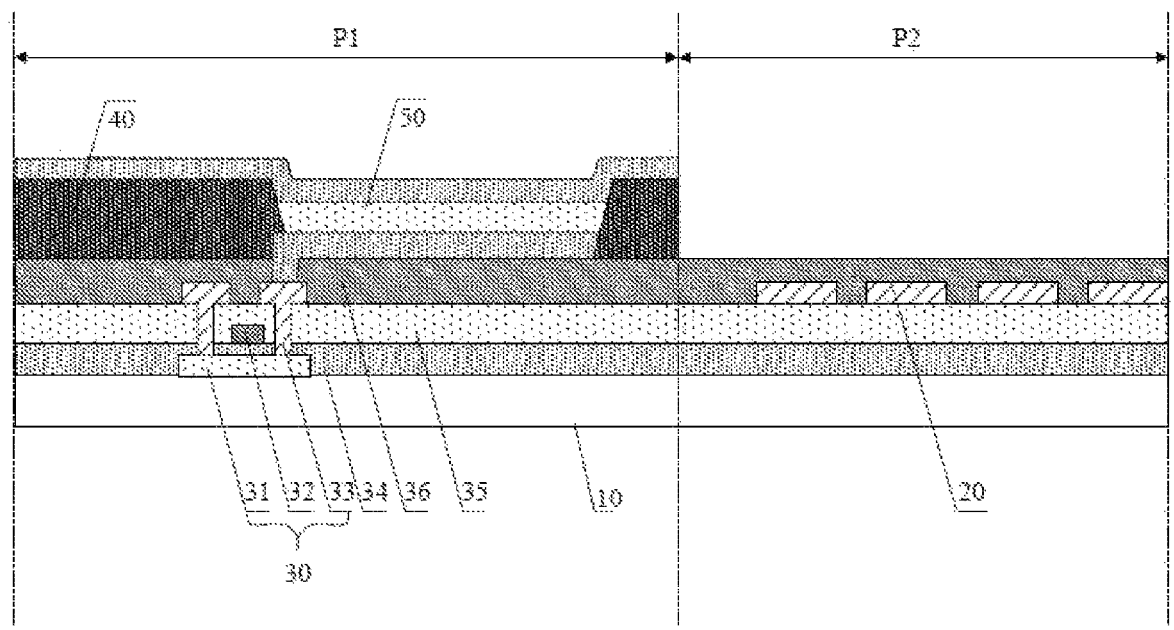
FIG. 4 is a sectional view of a display panel provided by an embodiment of the present disclosure in direction A-A.

FIG. 1 is a vertical view of a display panel provided by an embodiment of the present disclosure, FIG. 2 is a side view of a display panel provided by an embodiment of the present disclosure, FIG. 3 is a vertical view of a first power wire provided by an embodiment of the present disclosure, and FIG. 4 is a sectional view of a display panel provided by an embodiment of the present disclosure in direction A-A. As shown in FIG. 1 to FIG. 4, the display panel in the embodiments of the present disclosure is divided as a display area P1 and a non-display area P2 surrounding the display area P1. The non-display area P2 is provided with a fan-out area P3. The display panel includes: a substrate 10 and a first power wire 20 arranged on the substrate 10.

As shown in FIG. 2, a bending area BA is located at a side of the fan-out area P3 (shown in FIG. 1) away from the display area P1. The first power wire 20 is located in the non-display area P2, and at least part of an orthographic projection of the first power wire 20 on the substrate 10 is located in the fan-out area P3. As shown in FIG. 3, the first power wire 20 is provided with a plurality of first hollow parts V1 in a direction perpendicular to the substrate 10.

As shown in FIG. 2, the substrate 10 is bent. The display panel further includes: a support layer 11 arranged on one side, far away from the first power wire 20, of the substrate 10, and printing ink 12 used for covering the non-display area when the cover plate fits. As shown in FIG. 1 and FIG. 2, in order to prevent the printing ink 12 from entering the display area P1, a certain gap exists between the printing ink 12 and the display area P1, so that part of the first power wire is not covered by the printing ink.

In an exemplary embodiment, as shown in FIG. 4, the display panel further includes: a thin film transistor 30, a pixel defining layer 40, and a light-emitting device layer 50 which are located in the display area. The thin film transistor 30 includes: an active layer 31, a gate electrode 32, and a source-drain electrode 33. The thin film transistor may be of a top gate structure, or may be a bottom grate structure. FIG. 4 is an example in which the thin film transistor is of the top gate structure.

In an exemplary embodiment, the display panel further include: a gate insulating layer 34, an interlayer insulating layer 35, and an insulating layer 36. The insulating layer 36 includes: a passivation layer and a flat layer.

In an exemplary embodiment, the light-emitting device layer 50 includes: an anode connected to the source-drain electrode of the thin film transistor, a light-emitting material layer, and a cathode.

In an exemplary embodiment, the display panel may be an organic light-emitting diode display panel, or may be a quantum dot light-emitting diode display panel.

In an exemplary embodiment, the fan-out area is located on one side, far away from a camera and a telephone receiver, of the display panel.

In an exemplary embodiment, the substrate 10 may be a flexible substrate. The flexible substrate may be, but not limited to, one or more of polyethylene glycol terephthalate, polyethylene terephthalate, polyether-ether-ketone, polystyrene, polycarbonate, polyarylate, polyarylester, polyimide, polyvinyl chloride, polyethylene, and textile fibers.

The direction perpendicular to the substrate refers to a stacked arrangement direction of the first power wire and the substrate.

In an exemplary embodiment, the number of the first hollow parts V1 is determined according to an actual situation. The more the number of the first hollow parts V1, the smaller the reflective area of the first power wire 20.

In an exemplary embodiment, a manufacturing material of the first power wire 20 may be metal, for example: silver or aluminum, so as to ensure electrical conductivity of the first power wire 20.

The display panel provided by an embodiment of the present disclosure is divided as a display area and a non-display area surrounding the display area. The non-display area is provided with a fan-out area. The display panel includes: a substrate and a first power wire arranged on the substrate. The first power wire is located in the non-display area. At least part of an orthographic projection of the first power wire on the substrate is located in the fan-out area. The first power wire is provided with a plurality of first hollow parts in a direction perpendicular to the substrate. The present disclosure reduces the reflective area of the power wire by the first hollow parts arranged on the first power wire in the non-display area, which can weaken the light reflection of the power wire, thereby improving the display effect.

Figure 5A:
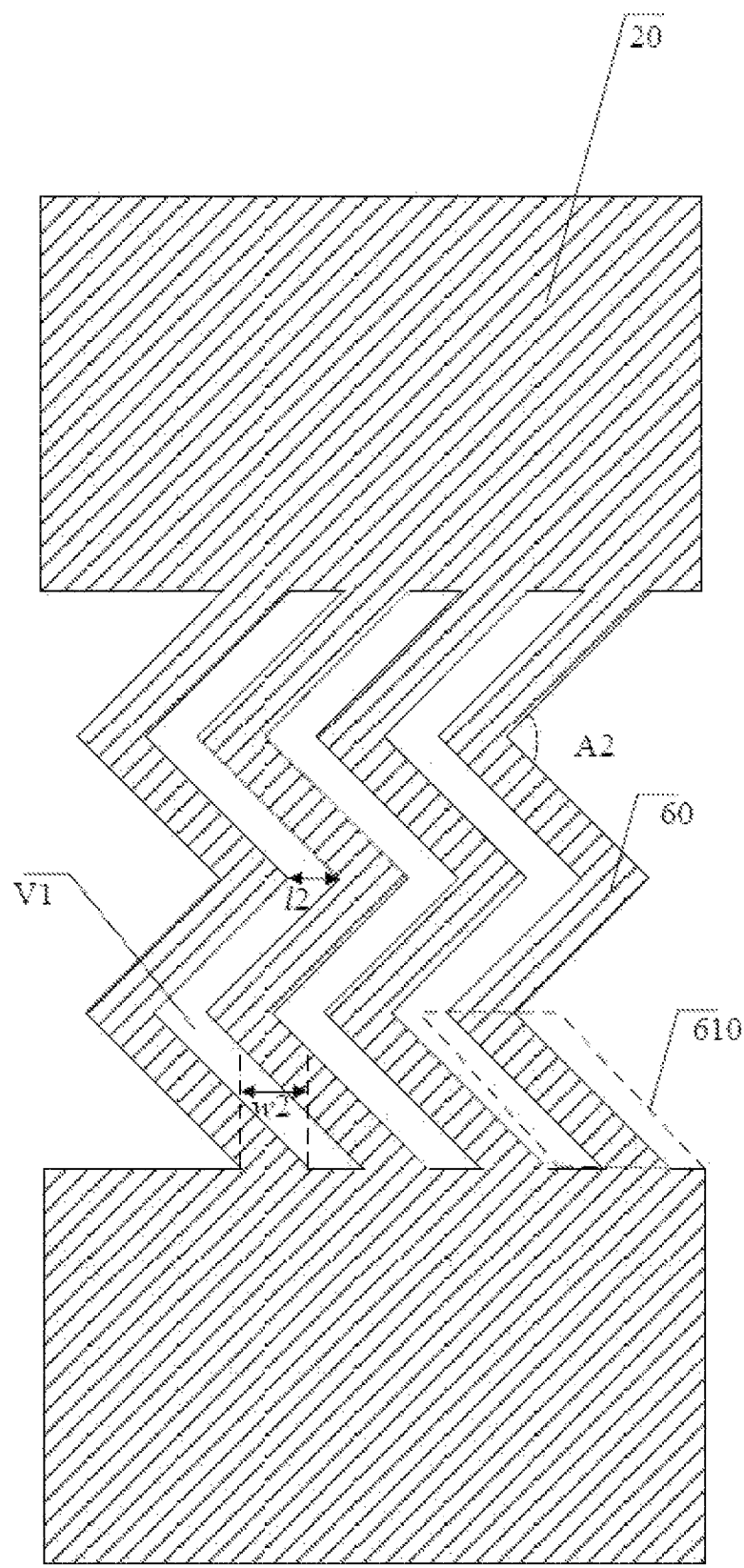
FIG. 5A is a schematic diagram of a structure of a first power wire in an exemplary embodiment.
Figure 5B:
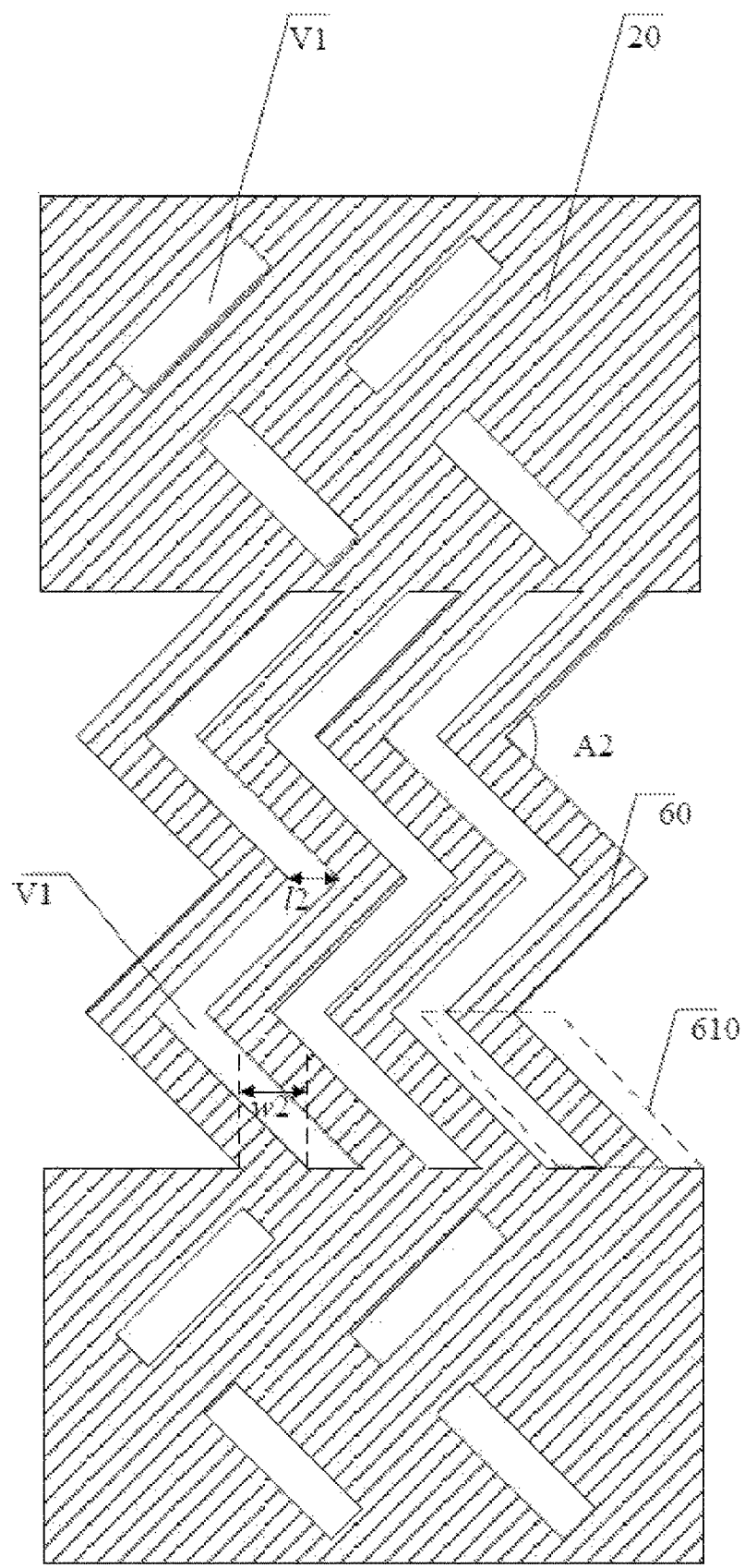
FIG. 5B is a schematic diagram of a structure of a first power wire in another exemplary embodiment.

FIG. 5A is a schematic diagram of a structure of a first power wire in an exemplary embodiment, FIG. 5B is a schematic diagram of a structure of a first power wire in another exemplary embodiment as shown in FIG. 5A and FIG. 5B. In an exemplary embodiment, the first power wire 20 further includes a plurality of second power wires 60 extending out from the first power wire 20. At least one of the first hollow parts V1 is formed between at least two of the plurality of second power wires 60. Both ends of each of the plurality of second power wires 60 are connected to the first power wire 20.

The plurality of second power wires 60 are arranged on the same layer. The plurality of second power wires are arranged in a direction parallel to an extending direction of the first power wire, and the second power wires and the first hollow parts are arranged alternately one by one. The extending direction of the first power wire refers to a direction parallel to or approximately parallel to an edge of one side of the display area close to the first power wire.

The first power wire provided in an exemplary embodiment includes second power wires, which can reduce the reflective area of the first power wire and weaken the light reflection of the power wire, thereby improving the display effect.

In an exemplary embodiment, the second power wires 60 include: a plurality of wires 610. The plurality of wires 610 are arranged in the extending direction of the second power wires 60. A first end of an ith wire is connected to a second end of an (i−1)th wire. A second end of an ith wire is connected to a first end of an (i+1)th wire. The extending directions of the odd wires are the same, and the extending directions of the even wires are the same. The included angle A2 between the two adjacent wires is greater than 0° and less than or equal to 180°.

A sum of a width w2 of the second power wire and a distance l2 between two adjacent second power wires is equal to an integral multiple of a dimension of the pixel located in the display area.

In an exemplary embodiment, the second power wires are in a shape of fold line. A shape of a cross section, perpendicular to the substrate, of the first hollow part located between the second power wires is an irregular shape. The light reflected by a bending part of the second power wires is divergent, so as not to be easily observed by a viewer, which weakens the light reflection of the display panel, and can improve the display effect.

In an exemplary embodiment, the display panel further includes: a signal line located in the non-display area and arranged on the same layer as a grate electrode of the thin film transistor. There is an overlapped area between the orthographic projection of the signal line on the substrate and the orthographic projection of the first power wire on the substrate. The interlayer insulating layer is located between the signal line and the first power wire. The extending direction of the signal line is perpendicular to or intersects with the extending direction of the first power wire.

In an exemplary embodiment, a shape of a cross section, perpendicular to the substrate, of the first hollow part V1 may include: a rectangle, or a shape of a cross section, perpendicular to the substrate, of the first hollow part V1 may be a circle, an oval, a diamond, or other shapes.

As shown in FIG. 3, in an exemplary embodiment, when there are a plurality of the first hollow parts V1, the plurality of first hollow parts V1 are arranged in rows and columns. The first hollow parts located on the same row are arranged in parallel. An included angle A1 between long edges of two adjacent rows of the first hollow parts is greater than 0° and less than or equal to 180°.

In an exemplary embodiment, the display panel further includes: a plurality of pixels arranged on the substrate. The pixels are located in the display area. For the first hollow parts located in the same row, a sum of the width w1 of each first hollow part and the distance l1 between two adjacent first hollow parts is equal to an integral multiple of the dimension of the pixel.

Figure 6A:
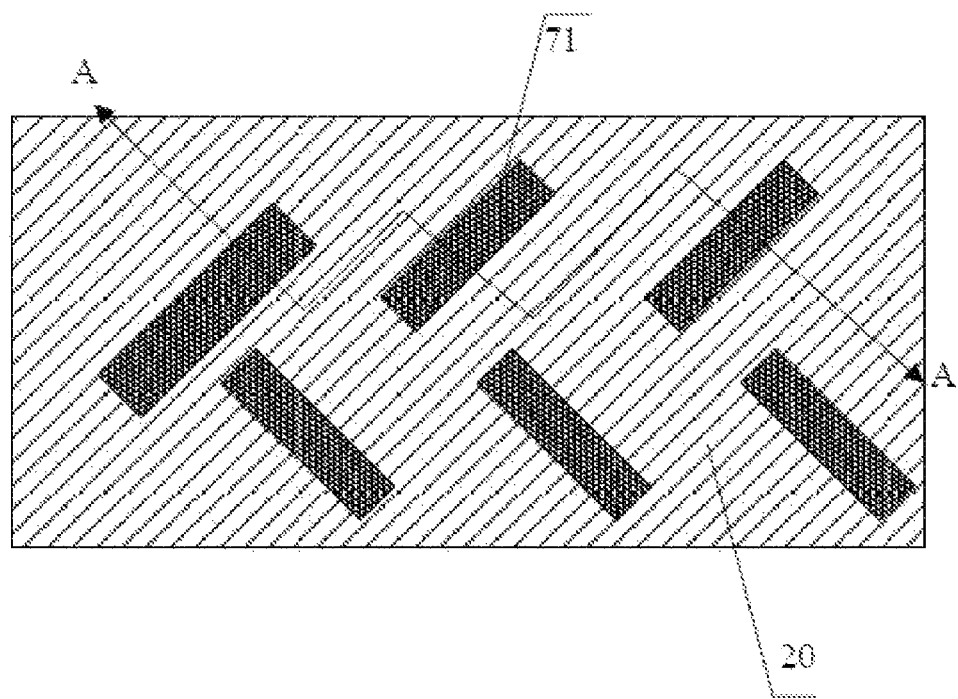
FIG. 6A is a vertical view of a display panel provided by an exemplary embodiment.
Figure 6B:
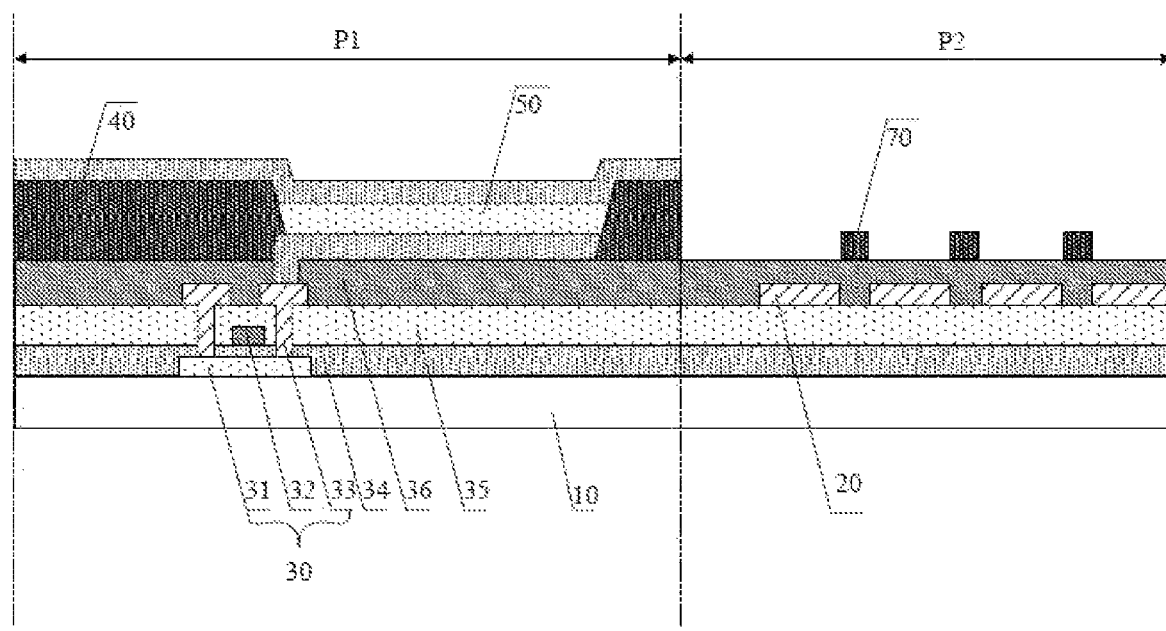
FIG. 6B is a sectional view of the display panel corresponding to FIG. 6A in direction A-A.

FIG. 6A is a vertical view of the display panel provided by an exemplary embodiment, and FIG. 6B is sectional view of the display panel corresponding to FIG. 6A in direction A-A. As shown in FIG. 6A and FIG. 6B, in an exemplary embodiment, the display panel further includes: a light-absorbing layer 70 located in the non-display area P2. An insulating layer 36 is located between the light-absorbing layer 70 and the first power wire 20.

The first power wire 20 is arranged on the same layer as the source-drain electrode 33 of the thin film transistor. The light-absorbing layer 70 is arranged on the same layer as the pixel defining layer 40, and is configured to absorb the light reflected by first power wire 20.

In an exemplary embodiment, thickness of the light-absorbing layer 70 may be 1.5 to 3 microns. The manufacturing material of the light-absorbing layer 70 may be photosensitive resin. The photosensitive resin includes: photoresist, polyimide, or polytetrafluoroethylene.

The display panel provided in an exemplary embodiment includes a light-absorbing layer, which can weaken the light reflection of the first power wire to a greater extent, so as to ensure a display effect of the display panel. The light reflection of the display panel provided with the light-absorbing layer and the first hollow parts is higher than that of the display panel only provided with the first hollow parts.

In an exemplary embodiment, the light-absorbing layer includes: a plurality of light-absorbing structures. The light-absorbing structures are in one-to-one correspondence with the first hollow parts.

In an exemplary embodiment, a shape of a cross section of the light-absorbing structure may be the same as or different from the shape of the cross section of the corresponding first hollow part. The shape of the cross section of the light-absorbing structure may be a rectangle, or may be a circle, an oval, or a diamond.

In an exemplary embodiment, as shown in FIG. 6A and FIG. 6B, the orthographic projection of the light-absorbing structure 71 on the substrate 10 coincides with the orthographic projection of the corresponding first hollow part V1 on the substrate 10. FIG. 6A and FIG. 6B are examples in which a shape of a cross section of the light-absorbing structure is the same as the shape of the cross section of the corresponding first hollow part.

Figure 7A:
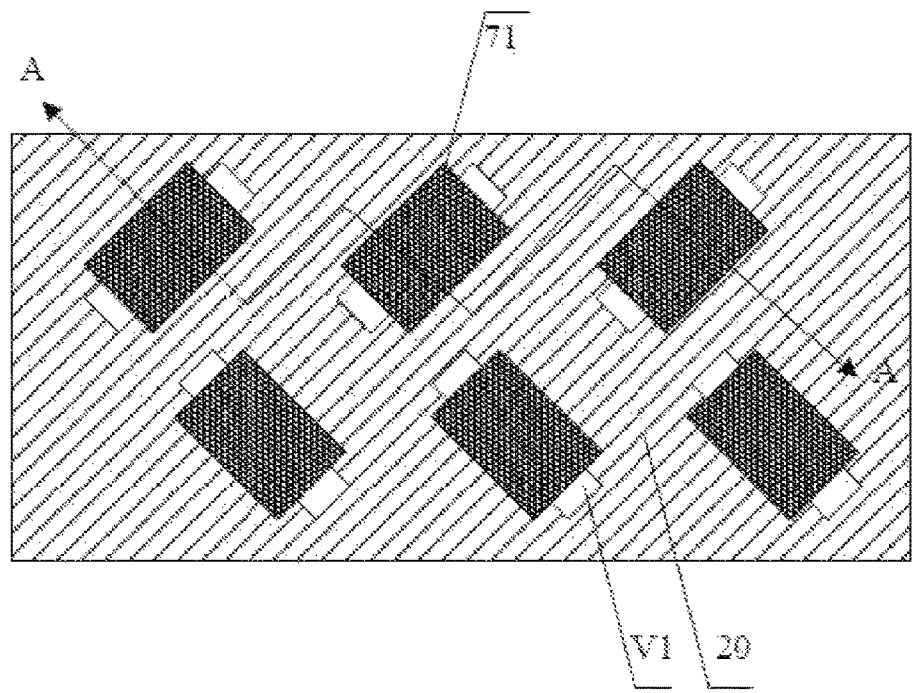
FIG. 7A is a vertical view of a display panel provided by an exemplary embodiment.
Figure 7B:
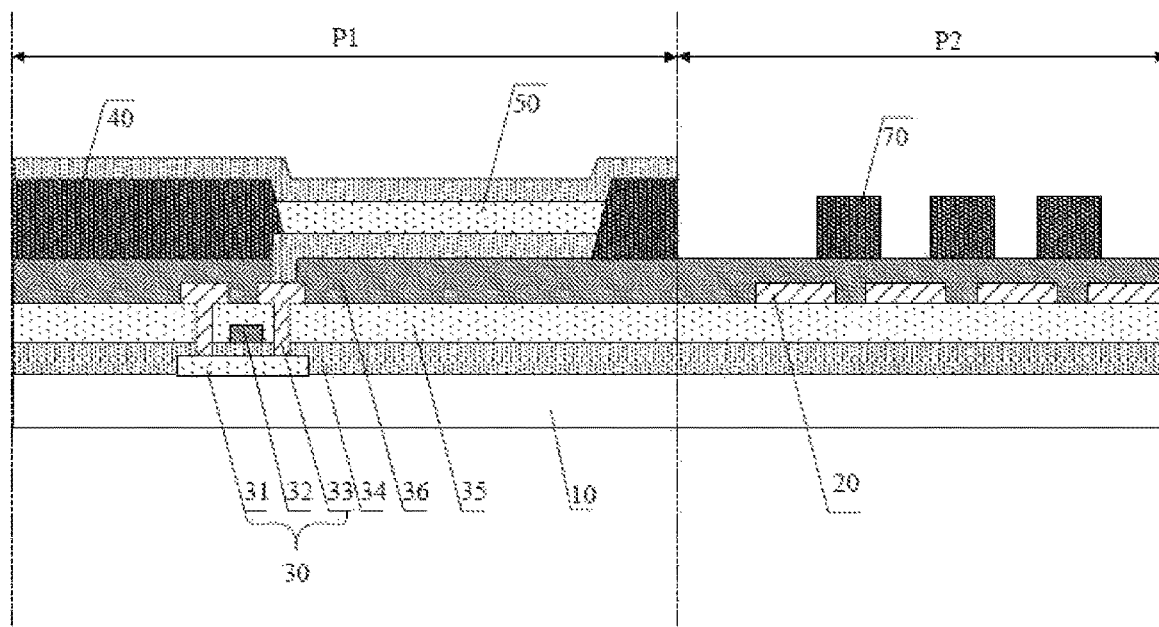
FIG. 7B is a sectional view of the display panel corresponding to FIG. 7A in direction A-A.

FIG. 7A is a vertical view of a display panel provided by an exemplary embodiment, and FIG. 7B is sectional view of the display panel corresponding to FIG. 7A in direction A-A. As shown in FIG. 7A and FIG. 7B, in an exemplary embodiment, there is an overlapped area between the orthographic projection of the light-absorbing structure 71 on the substrate 10 and the orthographic projection of the first hollow part V1 on the substrate 10.

In an exemplary embodiment, a length of a long edge of the first hollow part is greater than a length of a corresponding light-absorbing structure in the extending direction of the long edge of the first hollow part, and a length of a short edge of the first hollow part is less than the length of the corresponding light-absorbing structure in the extending direction of the short edge of the first hollow part.

Figure 8A:
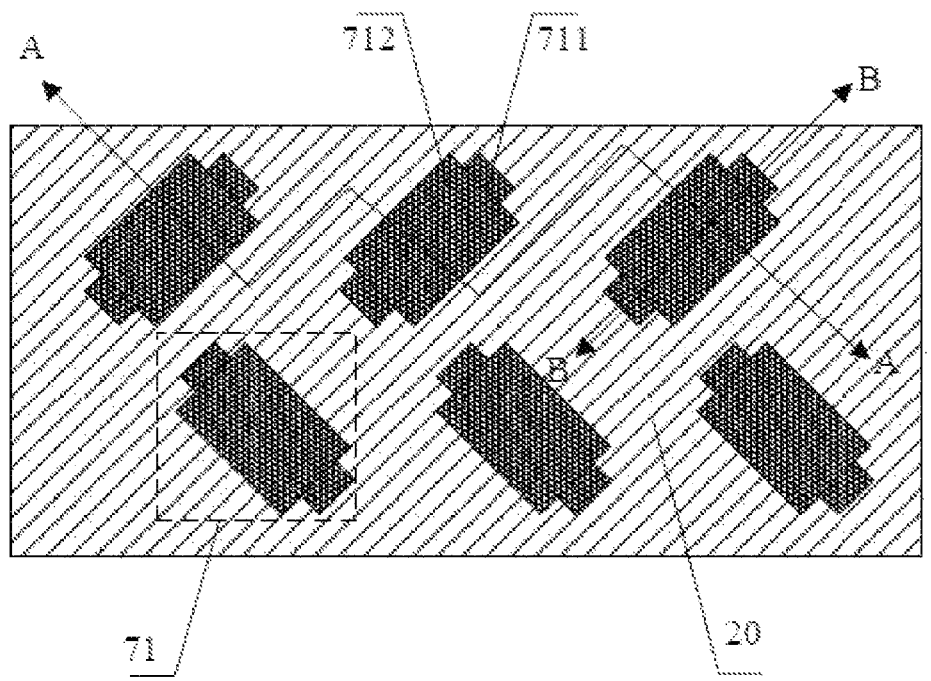
FIG. 8A is a vertical view of a display panel provided by an exemplary embodiment.
Figure 8B:
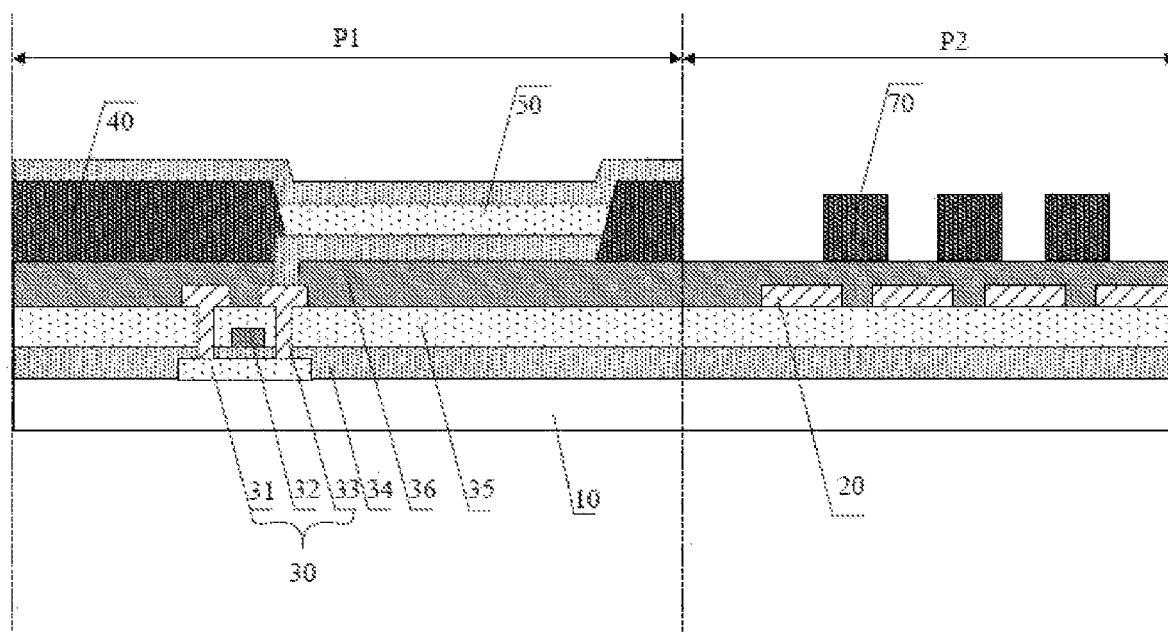
FIG. 8B is a sectional view of the display panel corresponding to FIG. 8A in direction A-A.
Figure 8C:
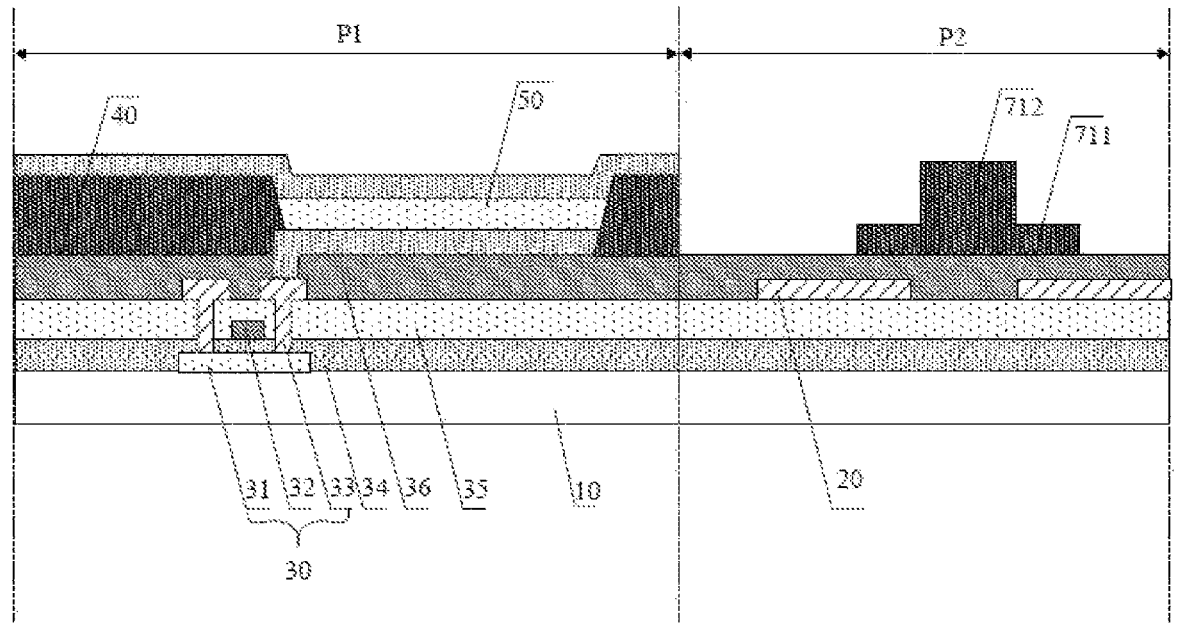
FIG. 8C is a sectional view of the display panel corresponding to FIG. 8A in direction B-B.

FIG. 8A is a vertical view of a display panel provided by an exemplary embodiment, FIG. 8B is a sectional view of the display panel corresponding to FIG. 8A in direction A-A, and FIG. 8C is a sectional view of the display panel corresponding to FIG. 8A in direction B-B. As shown in FIG. 8A to FIG. 8C, in an exemplary embodiment, the orthographic projection of the light-absorbing structure 71 on the substrate covers the orthographic projection of the corresponding first hollow part on the substrate.

The light-absorbing structure 71 includes: a first light-absorbing part 711 and a second light-absorbing part 712 formed integrally. The first light-absorbing part 711 is located on one side, close to the first power wire 20, of the second light-absorbing part 712. The orthographic projection of the first light-absorbing part 711 on the substrate coincides with the orthographic projection of the corresponding first hollow part on the substrate. There is an overlapped area between The orthographic projection of the second light-absorbing part 712 on the substrate and the orthographic projection of the corresponding first hollow part on the substrate.

In an exemplary embodiment, the length of the long edge of the first hollow part is greater than the length of the second light-absorbing part of the corresponding light-absorbing structure in the extending direction of the long edge of the first hollow part, and the length of the short edge of the first hollow part is less than the length of the second light-absorbing part of the corresponding light-absorbing structure in the extending direction of the short edge of the first hollow part.

Figure 9A:
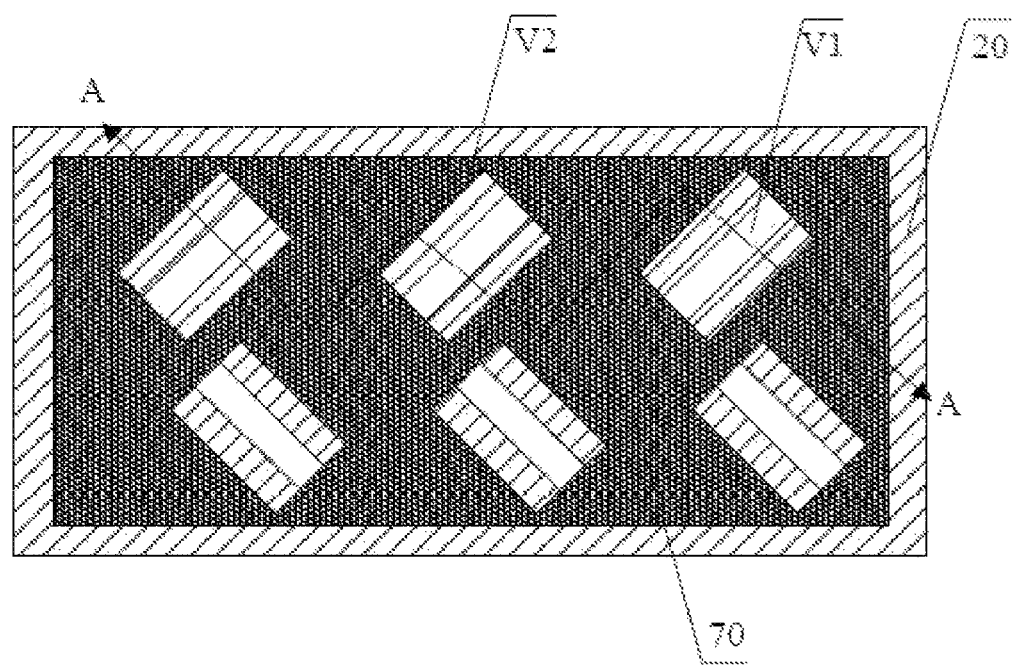
FIG. 9A is a vertical view of a display panel provided by an exemplary embodiment.
Figure 9B:
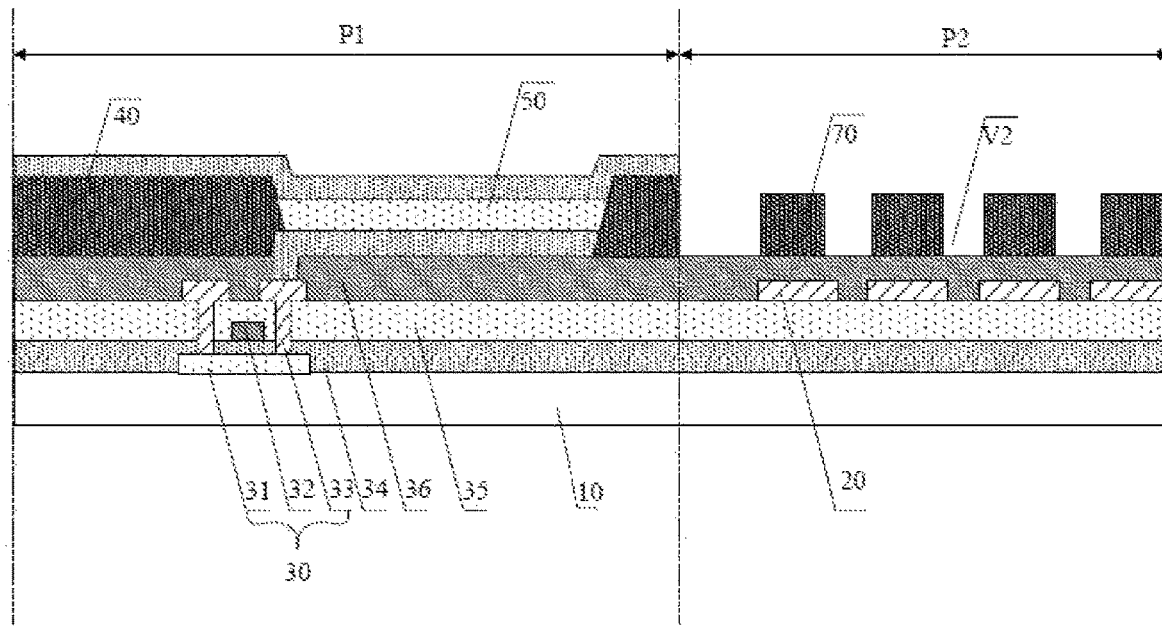
FIG. 9B is a sectional view of the display panel corresponding to FIG. 9A in direction A-A.

FIG. 9A is a vertical view of a display panel provided by an exemplary embodiment, and FIG. 9B is a sectional view of the display panel corresponding to FIG. 9A in direction A-A. In an exemplary embodiment, the light-absorbing layer 70 includes: a plurality of second hollow parts V2. The second hollow parts V2 are in one-to-one correspondence with the first hollow parts V1.

In an exemplary embodiment, the orthographic projection of the second hollow part V2 on the substrate coincides with the orthographic projection of the corresponding first hollow part V1 on the substrate.

In an exemplary embodiment, there is an overlapped area between the orthographic projection of the second hollow part V2 on the substrate and the orthographic projection of the first hollow part V1 on the substrate.

In an exemplary embodiment, the length of the long edge of the first hollow part is greater than the length of the corresponding second hollow part in the extending direction of the long edge of the first hollow part, and the length of the short edge of the first hollow part is less than the length of the corresponding second hollow part in the extending direction of the short edge of the first hollow part. FIG. 9A and FIG. 9B are described by taking an example in which there is an overlapped area between the orthographic projection of the second hollow part on the substrate and the orthographic projection of the corresponding first hollow part on the substrate.

An embodiment of the present disclosure further provides a display apparatus, including a display panel.

The display panel is provided by the previously described embodiments. The implementation principle and implementation effect are similar, which will not be described herein in detail.

In an exemplary embodiment, the display apparatus may be: a product or part with a display function, for example, a mobile phone, a tablet computer, a television, a display, a notebook computer, a digital photo frame, or a navigator. Other essential components of the display apparatus should be understood to have by those of ordinary skill in the art, which will not be described herein in detail, and should not be regarded as a limitation to the present invention.

Figure 10:
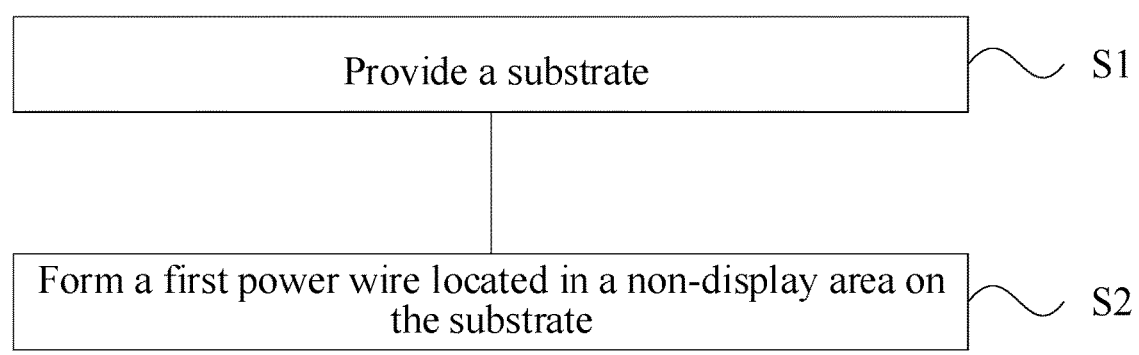
FIG. 10 is a flowchart of a manufacturing method for a display panel provided by an embodiments of the present disclosure.

FIG. 10 is a flowchart of a manufacturing method for a display panel provided by an embodiment of the present disclosure. As shown in FIG. 10, the embodiment of the present disclosure further provides a manufacturing method for a display panel, which is used for manufacturing the display panel. The display panel is divided into a display area and a non-display area surrounding the display area. The non-display area is provided with a fan-out area. The manufacturing method for the display panel provided by an embodiment of the present disclosure includes the following acts.

In act S1, a substrate is provided.

In an exemplary embodiment, the substrate may be a flexible substrate. The flexible substrate may be, but not limited to, one or more of polyethylene glycol terephthalate, polyethylene terephthalate, polyether-ether-ketone, polystyrene, polycarbonate, polyarylate, polyarylester, polyimide, polyvinyl chloride, polyethylene, and textile fibers.

In act S2, a first power wire located in the non-display area is formed on the substrate.

At least part of the orthographic projection of the first power wire is located in the fan-out area. The first power wire is provided with a plurality of first hollow parts in the direction perpendicular to the substrate.

The display panel is provided by the previously described embodiments. The implementation principle and implementation effect are similar, which will not be described herein in detail.

In an exemplary embodiment, the act S2 includes: the first power wire that is located in the non-display area and includes a plurality of second power wires extending out from the first power wire is formed on the substrate.

In an exemplary embodiment, the act S2 includes: a source-drain electrode of a thin film transistor located in the display area and the first power wire located in the non-display area are formed on the substrate by using the same process.

In an exemplary embodiment, after the act S2, the manufacturing method for the display panel further includes: a pixel defining layer located in the display area and a light-absorbing layer located in the non-display area are formed on one side, far away from the substrate, of the first power wire by using the same process.

Figure 11A:
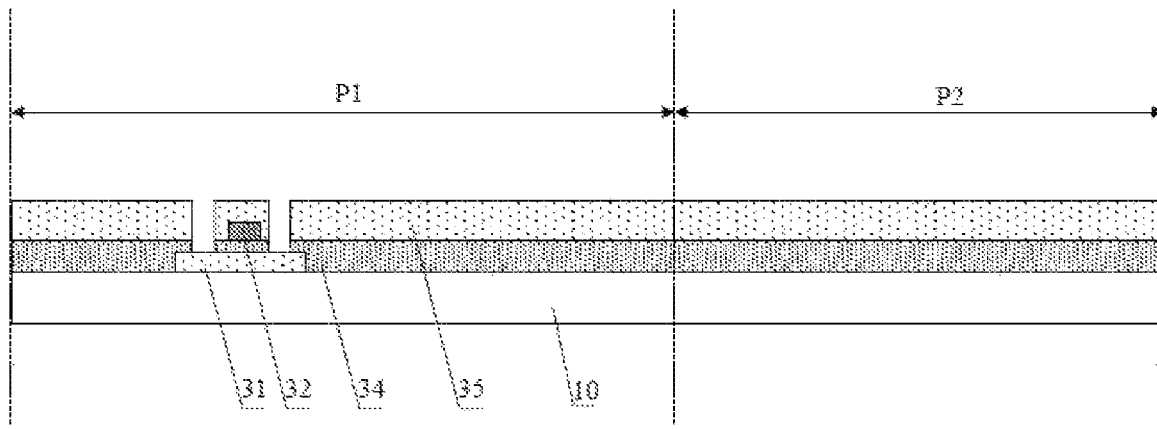
FIG. 11A is one schematic diagram of a manufacturing method for a display panel provided by an exemplary embodiment.
Figure 11B:
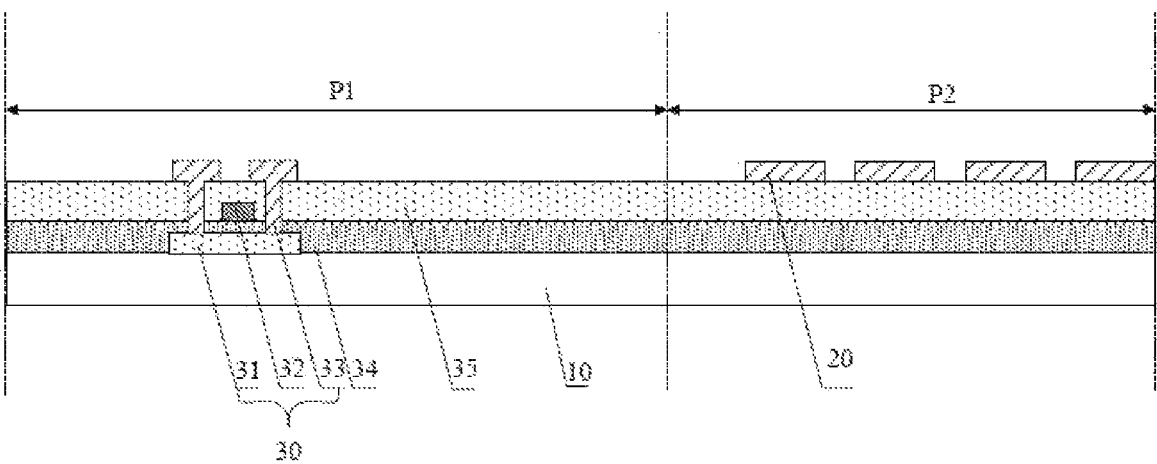
FIG. 11B is another schematic diagram of a manufacturing method for a display panel provided by an exemplary embodiment.

A technical solution provided by an exemplary embodiment is described according to a manufacturing process of the display panel with reference to FIG. 11A to FIG. 11B.

In act S100, the substrate 10 is provided, and an active layer 31, a gate insulating layer 34, a gate electrode 32, and an interlayer insulating layer 35 of the thin film transistor are formed on the substrate 10 in sequence, as shown in FIG. 11A.

In act S200, a source-drain electrode 33 of the thin film transistor located in a display area P1 and a first power wire 20 located in a non-display area P2 are formed on the interlayer insulating layer 35, specifically as shown in FIG. 11B.

In act S300, an insulating layer 36 is formed on a source-drain electrode 33, and a pixel defining layer 40 located in the display area and light-absorbing layers 70 located in the non-display area are formed on the insulating layer 36, specifically as shown in FIG. 6B, FIG. 7B, FIG. 8B, FIG. 8C, and FIG. 9B.

The accompanying drawings of the embodiments of the present disclosure only relate to the structures related to the embodiments of the present disclosure, and other structures can refer to general designs.

In conclusion, the present disclosure provides a display panel and a display apparatus. The display panel is divided into a display area and a non-display area surrounding the display area. The non-display area is provided with a fan-out area. The display panel includes: a substrate and a first power wire arranged on the substrate. The first power wire is located in the non-display area. At least part of the orthographic projection of the first power wire on the substrate is located in the fan-out area. The first power wire is provided with a plurality of first hollow parts in the direction perpendicular to the substrate. The present disclosure reduces the reflective area of the power wire by the first hollow parts arranged on the first power wire in the non-display area, which can weaken the light reflection of the power wire, thereby improving the display effect.

For clarity, the thickness and dimension of layers or micro-structures are magnified in the accompanying draw-

We claim:

1. A display panel, comprising a display area and a non-display area surrounding the display area, wherein:
the non-display area is provided with a fan-out area and a bending area located at a side of the fan-out area away from the display area; the display panel comprises: a substrate and a first power wire arranged on the substrate;
the first power wire is located in the non-display area; and the first power wire is provided with a plurality of first hollow parts in a direction perpendicular to the substrate;
the display panel further comprises a light-absorbing layer located in the non-display area, wherein the light-absorbing layer is arranged on a same layer as a pixel defining layer, and is configured to absorb light reflected by the first power wire;
the light-absorbing layer comprises: a plurality of light-absorbing structures; and the plurality of light-absorbing structures are in one-to-one correspondence with the plurality of first hollow parts;
orthographic projections of the plurality of light-absorbing structures on the substrate overlap with orthographic projections of corresponding first hollow parts on the substrate; and
a length of a long edge of at least one first hollow part of the plurality of first hollow parts is greater than a length of a corresponding light-absorbing structure of the plurality of light-absorbing structures in an extending direction of the long edge of the at least one first hollow part, and a length of a short edge of the at least one first hollow part is less than a length of the corresponding light-absorbing structure in an extending direction of the short edge of the at least one first hollow part.

2. The display panel according to claim 1, wherein the first power wire further comprises a plurality of second power wires extending from the first power wire; at least one of the first hollow parts is located between at least two of the plurality of second power wires; and both ends of each of the plurality of second power wires are connected to the first power wire.

3. The display panel according to claim 2, wherein the plurality of second power wires are arranged in a direction parallel to an extending direction of the first power wire, and the plurality of second power wires and the plurality of first hollow parts are arranged alternately one by one.

4. The display panel according to claim 1, wherein a shape of a cross section, perpendicular to the substrate, of one or more of the plurality of first hollow parts comprises: a rectangle.

5. The display panel according to claim 4, wherein when there are a plurality of the first hollow parts, the plurality of first hollow parts are arranged in rows and columns;
the first hollow parts located in a same row are arranged in parallel; and an included angle between long edges of the first hollow parts of two adjacent rows is greater than 0° and less than or equal to 180°.

6. The display panel according to claim 5, further comprising: a plurality of pixels arranged on the substrate, wherein the plurality of pixels are located in the display area;
for the first hollow parts located in the same row, a sum of a width of each first hollow part and a distance between two adjacent first hollow parts is equal to an integral multiple of a dimension of a pixel.

7. The display panel according to claim 6, further comprising: an insulating layer, and a thin film transistor and the pixel defining layer, wherein the thin film transistor and the pixel defining layer are located in the display area,
wherein the insulating layer is located between the light-absorbing layer and the first power wire; the first power wire is arranged on a same layer as a source-drain electrode of the thin film transistor.

8. The display panel according to claim 7, wherein the light-absorbing layer comprises: a plurality of second hollow parts;
the plurality of second hollow parts are in one-to-one correspondence with the plurality of first hollow parts.

9. The display panel according to claim 8, wherein orthographic projections of the plurality of second hollow parts on the substrate coincide with orthographic projections of corresponding first hollow parts on the substrate; or orthographic projections of the plurality of second hollow parts on the substrate overlap with orthographic projections of corresponding first hollow parts on the substrate.

10. The display panel according to claim 2, wherein one or more of the plurality of second power supply wires comprise: a plurality of wires; the plurality of wires are arranged in an extending direction of the second power wires; a first end of an ith wire is connected to a second end of an (i−1)th wire; a second end of the ith wire is connected to a first end of an (i+1)th wire;
extending directions of odd wires are same, and extending directions of even wires are same; an included angle between two adjacent wires is greater than 0° and less than or equal to 180°; and
a sum of a width of each second power wire and a distance between two adjacent second power wires is equal to an integral multiple of a dimension of a pixel located in the display area.

11. A display apparatus, comprising the display panel according to claim 1.

12. The display panel according to claim 2, wherein a shape of a cross section, perpendicular to the substrate, of one or more of the plurality of first hollow parts comprises: a rectangle.

* * * * *